United States Patent
Tsai et al.

(10) Patent No.: US 9,677,820 B2
(45) Date of Patent: Jun. 13, 2017

(54) ELECTRONIC DEVICE AND LIQUID COOLING HEAT DISSIPATION STRUCTURE THEREOF

(71) Applicant: COOLER MASTER CO., LTD., New Taipei (TW)

(72) Inventors: Shui-Fa Tsai, New Taipei (TW); Chun-Hung Lin, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 185 days.

(21) Appl. No.: 14/708,429

(22) Filed: May 11, 2015

(65) Prior Publication Data

US 2016/0338223 A1 Nov. 17, 2016

(51) Int. Cl.

| H01L 23/473 | (2006.01) |
|---|---|
| F28F 1/00 | (2006.01) |
| H05K 7/20 | (2006.01) |
| F04D 1/00 | (2006.01) |
| G06F 1/20 | (2006.01) |
| F04D 13/14 | (2006.01) |

(52) U.S. Cl.
CPC ........... *F28F 1/00* (2013.01); *F04D 1/003* (2013.01); *G06F 1/20* (2013.01); *H01L 23/473* (2013.01); *H05K 7/20272* (2013.01); *F04D 13/14* (2013.01)

(58) Field of Classification Search
CPC ........... H05K 7/20272; H05K 7/20327; H01L 23/473; F04D 1/003; F04D 13/14
USPC ....... 165/80.4, 104.33; 361/699; 415/60, 61; 417/286, 423.5, 426
See application file for complete search history.

(56) References Cited

U.S. PATENT DOCUMENTS

| 2,810,345 A * | 10/1957 | Englesson | ............... F04D 13/14 |
| | | | 415/61 |
| 4,177,018 A * | 12/1979 | Granet | .................. F04D 15/029 |
| | | | 417/338 |
| 4,738,584 A * | 4/1988 | Price | ................... B01F 7/00733 |
| | | | 415/203 |
| 6,648,064 B1 * | 11/2003 | Hanson | ................. H01L 23/473 |
| | | | 165/104.25 |
| 7,055,581 B1 * | 6/2006 | Roy | ...................... H01L 23/427 |
| | | | 165/104.21 |
| 7,222,661 B2 * | 5/2007 | Wei | ....................... H01L 23/467 |
| | | | 165/104.33 |

(Continued)

*Primary Examiner* — Allen Flanigan
(74) *Attorney, Agent, or Firm* — Li & Cai Intellectual Property (USA) Office

(57) ABSTRACT

A liquid cooling heat dissipation structure includes a heat-conducting substrate, a fluid-splitting board, a fluid-conducting board, and a liquid supply module. The heat-conducting substrate has a heat-conducting body contacting a heat generation source and a plurality of heat-dissipating fins disposed on the heat-conducting body. The fluid-splitting board is disposed on the heat-dissipating fins. The fluid-conducting board is disposed on the fluid-splitting board. The liquid supply module includes an external cover body detachably disposed on the heat-conducting body and at least two pumps detachably disposed on the external cover body. The external cover body has at least one liquid inlet and at least one liquid outlet, and cooling liquid flows into the external cover body through the at least one liquid inlet and flows out of the external cover body through the at least one liquid outlet by driving one or all of the at least two pumps.

16 Claims, 12 Drawing Sheets

(56) References Cited

U.S. PATENT DOCUMENTS

| | | | |
|---|---|---|---|
| 7,548,425 B2* | 6/2009 | Hata | G06F 1/203 |
| | | | 165/80.4 |
| 7,753,662 B2* | 7/2010 | Lai | F04D 13/0606 |
| | | | 165/80.4 |
| 2006/0007656 A1* | 1/2006 | Symons | H01L 23/473 |
| | | | 361/699 |

* cited by examiner

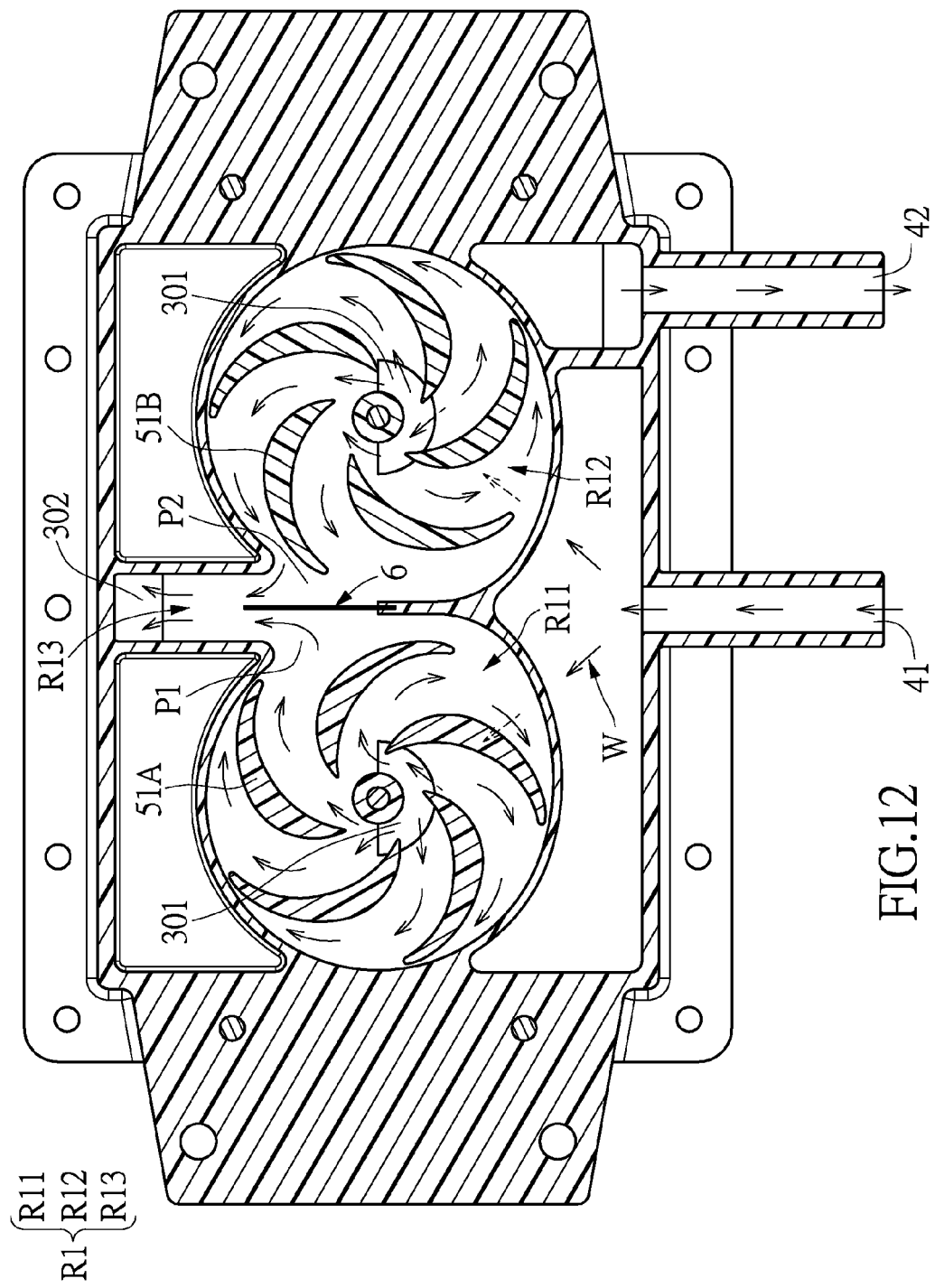

ELECTRONIC DEVICE AND LIQUID COOLING HEAT DISSIPATION STRUCTURE THEREOF

BACKGROUND OF THE INVENTION

1. Field of the Invention

The instant disclosure relates to an electronic device and a liquid cooling heat dissipation structure thereof, and more particularly to an electronic device and a liquid cooling heat dissipation structure thereof for increasing its whole heat dissipation efficiency.

2. Description of Related Art

Over the years, the processing velocity of CPUs has become faster, thus generating larger amounts of heat. In order to dissipate the heat from the heat source to the external world, a heat-dissipating device and a fan are usually used to help dissipate the heat. However, the fan is noisy and consumes lots of power due to its high rotational speed. It has so far proven difficult for designers to solve these problems of noise and power consumption.

In order to solve the above-mentioned question, the prior art provides a water block heat-dissipating structure including a seat body and a seal cover body. The seat body has a plurality of heat-dissipating fins formed thereon, and a bottom portion of the seat body contacting a heat-generating source. In addition, the seal cover body is used to seal and cover the seat body. The seal cover body further has a water inlet and a water outlet. When the bottom portion of the seat body contacts a heat-generating source, heat is transmitted from the heat-generating source to the heat-dissipating fins. In addition, the heat of the first heat-dissipating fins can be guided away quickly by cooling liquids that circulate between the water inlet and the water outlet.

SUMMARY OF THE INVENTION

One aspect of the instant disclosure relates to an electronic device and a liquid cooling heat dissipation structure thereof for increasing its whole heat dissipation efficiency.

One of the embodiments of the instant disclosure provides a liquid cooling heat dissipation structure, comprising: a heat-conducting substrate, a fluid-splitting board, a fluid-conducting board, and a liquid supply module. The heat-conducting substrate has a heat-conducting body contacting a heat generation source and a plurality of heat-dissipating fins disposed on the heat-conducting body. The fluid-splitting board is disposed on the heat-dissipating fins. The fluid-conducting board is disposed on the fluid-splitting board. The liquid supply module includes an external cover body detachably disposed on the heat-conducting body and at least two pumps detachably disposed on the external cover body, wherein the heat-dissipating fins, the fluid-splitting board, and the fluid-conducting board are received inside the external cover body. More particularly, the fluid-conducting board has at least two first fluid-conducting openings respectively corresponding to the at least two pumps and a second fluid-conducting opening communicated with the at least two first fluid-conducting openings through a first receiving space, and the fluid-splitting board has a first fluid-splitting opening communicated with the second fluid-conducting opening through a second receiving space and a second fluid-splitting opening communicated with the first fluid-splitting opening through a third receiving space. The external cover body has at least one liquid inlet communicated with the at least two first fluid-conducting openings through a fourth receiving space and at least one liquid outlet communicated with the second fluid-splitting opening through a fifth receiving space, and cooling liquid flows into the external cover body through the at least one liquid inlet and flows out of the external cover body through the at least one liquid outlet by driving one or all of the at least two pumps.

Another one of the embodiments of the instant disclosure provides an electronic device including a liquid cooling heat dissipation structure disposed on at least one heat generation source thereof. The liquid cooling heat dissipation structure comprising: a heat-conducting substrate, a fluid-splitting board, a fluid-conducting board, and a liquid supply module. The heat-conducting substrate has a heat-conducting body contacting the at least one heat generation source and a plurality of heat-dissipating fins disposed on the heat-conducting body. The fluid-splitting board is disposed on the heat-dissipating fins. The fluid-conducting board is disposed on the fluid-splitting board. The liquid supply module includes an external cover body detachably disposed on the heat-conducting body and at least two pumps detachably disposed on the external cover body, wherein the heat-dissipating fins, the fluid-splitting board, and the fluid-conducting board are received inside the external cover body. More particularly, the fluid-conducting board has at least two first fluid-conducting openings respectively corresponding to the at least two pumps and a second fluid-conducting opening communicated with the at least two first fluid-conducting openings through a first receiving space, and the fluid-splitting board has a first fluid-splitting opening communicated with the second fluid-conducting opening through a second receiving space and a second fluid-splitting opening communicated with the first fluid-splitting opening through a third receiving space. The external cover body has at least one liquid inlet communicated with the at least two first fluid-conducting openings through a fourth receiving space and at least one liquid outlet communicated with the second fluid-splitting opening through a fifth receiving space, and cooling liquid flows into the external cover body through the at least one liquid inlet and flows out of the external cover body through the at least one liquid outlet by driving one or all of the at least two pumps.

Yet another one of the embodiments of the instant disclosure provides a liquid cooling heat dissipation structure, comprising: a heat-conducting substrate, a fluid-splitting board, a fluid-conducting board, and a liquid supply module. The heat-conducting substrate has a heat-conducting body contacting a heat generation source and a plurality of heat-dissipating fins disposed on the heat-conducting body. The fluid-splitting board is disposed on the heat-dissipating fins. The fluid-conducting board is disposed on the fluid-splitting board. The liquid supply module includes an external cover body detachably disposed on the heat-conducting body and at least two pumps detachably disposed on the external cover body, wherein the heat-dissipating fins, the fluid-splitting board, and the fluid-conducting board are received inside the external cover body. More particularly, the external cover body has at least one liquid inlet and at least one liquid outlet, and cooling liquid flows into the external cover body through the at least one liquid inlet and flows out of the external cover body through the at least one liquid outlet by driving one or all of the at least two pumps.

More particularly, one of the at least two pumps has a first rotary component disposed between the external cover body and the fluid-conducting board, the other pump has a second rotary component disposed between the external cover body and the fluid-conducting board and adjacent to the first rotary component, wherein the first receiving space has a first space portion receiving the first rotary component and communicated with one of the at least two first fluid-conducting openings, a second space portion receiving the second rotary component and communicated with the other first fluid-conducting opening, and a common space portion corresponding to the first space portion and the second space portion and communicated with the second fluid-conducting opening, wherein the common space portion is communicated with the first space portion through a first connection opening, and the common space portion is communicated with the second space portion through a second connection opening.

When the cooling liquid flows inside the external cover body by driving the first rotary component only, the movable component is pushed toward the second space portion to enclose the second connection opening by the cooling liquid, so that the cooling liquid is transmitted to the common space portion through the first connection opening only.

When the cooling liquid flows inside the external cover body by driving the second rotary component only, the movable component is pushed toward the first space portion to enclose the first connection opening by the cooling liquid, so that the cooling liquid is transmitted to the common space portion through the second connection opening only.

When the cooling liquid flows inside the external cover body by concurrently driving the first rotary component and the second rotary component, the movable component is pushed and substantially disposed between the first space portion and the second space portion for concurrently opening the first connection opening and the second connection opening by the cooling liquid, so that the cooling liquid is transmitted to the common space portion through both the first connection opening and the second connection opening.

Therefore, the heat dissipation efficiency of the electronic device and the liquid cooling heat dissipation structure is increased due to the design of "the liquid supply module including an external cover body detachably disposed on the heat-conducting body and at least two pumps detachably disposed on the external cover body".

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

FIG. 12 shows a schematic view of the liquid cooling heat dissipation structure concurrently using a second rotary component according to the instant disclosure.

DETAILED DESCRIPTION OF THE PREFERRED EMBODIMENTS

The embodiments of "an electronic device and a liquid cooling heat dissipation structure thereof" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

Figure 3:
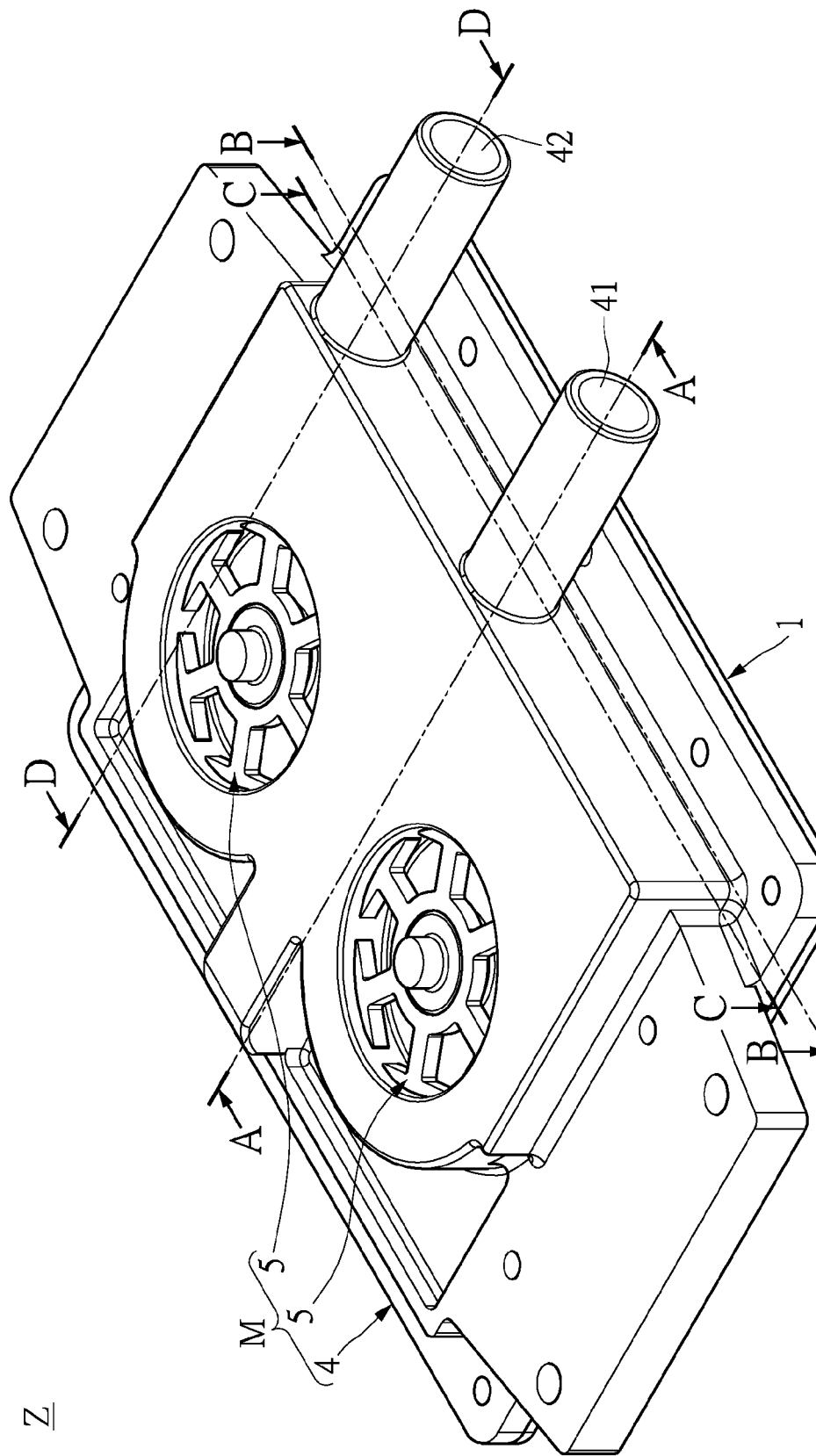
FIG. 3 shows a perspective, assembly, schematic view of the liquid cooling heat dissipation structure according to the instant disclosure.
Figure 4:
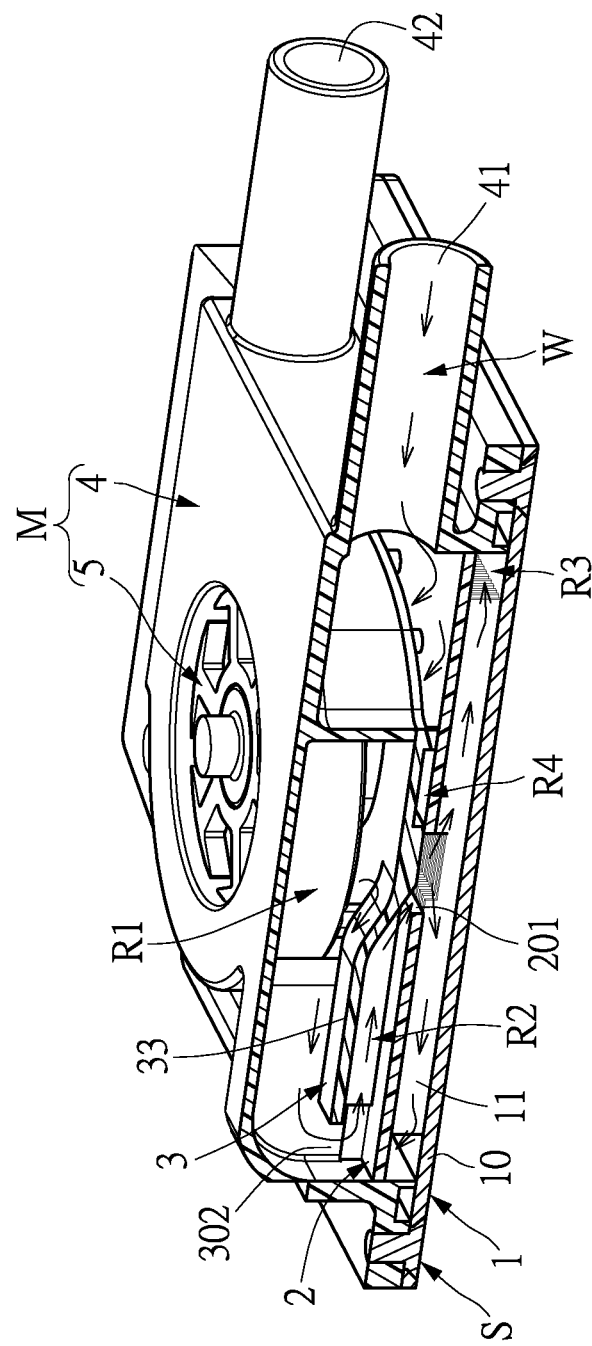
FIG. 4 shows a perspective, cross-sectional view taken along the section line A-A of FIG. 3.
Figure 5:
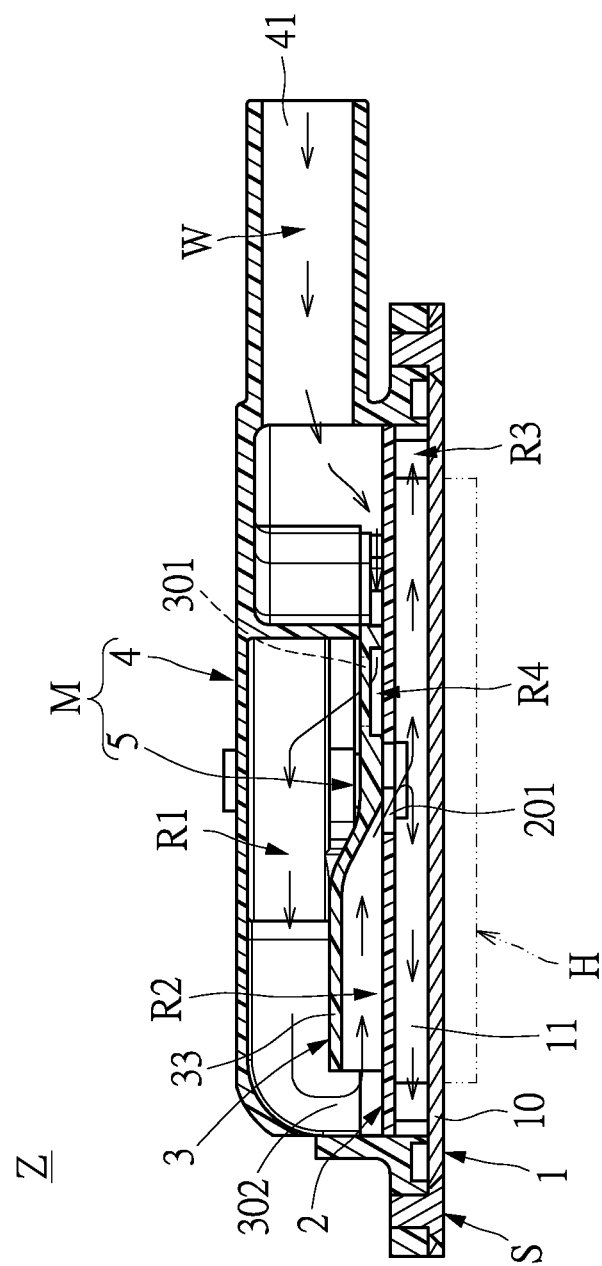
FIG. 5 shows a lateral, cross-sectional view taken along the section line A-A of FIG. 3.
Figure 6:
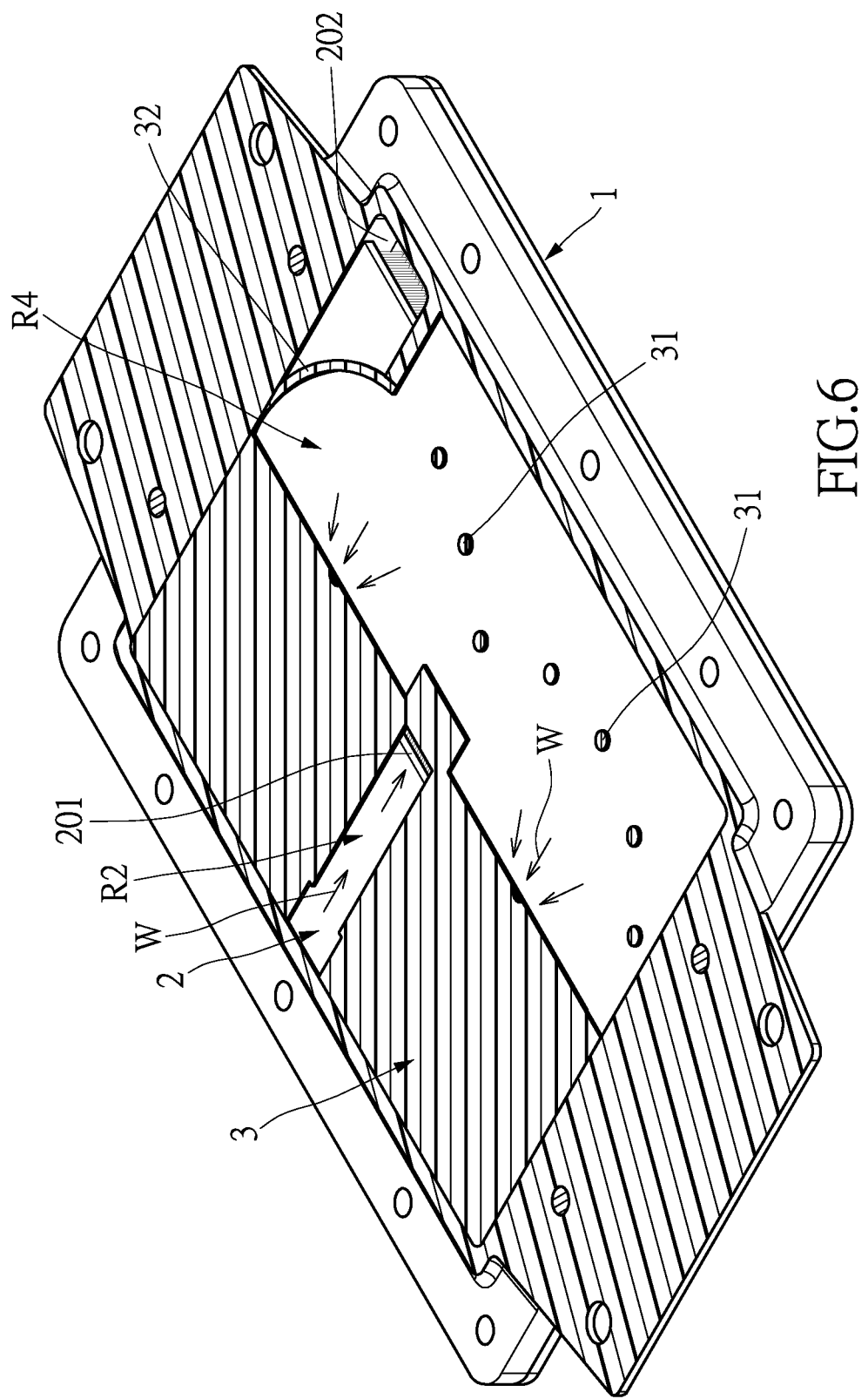
FIG. 6 shows a perspective, cross-sectional view taken along the section line B-B of FIG. 3.
Figure 7:
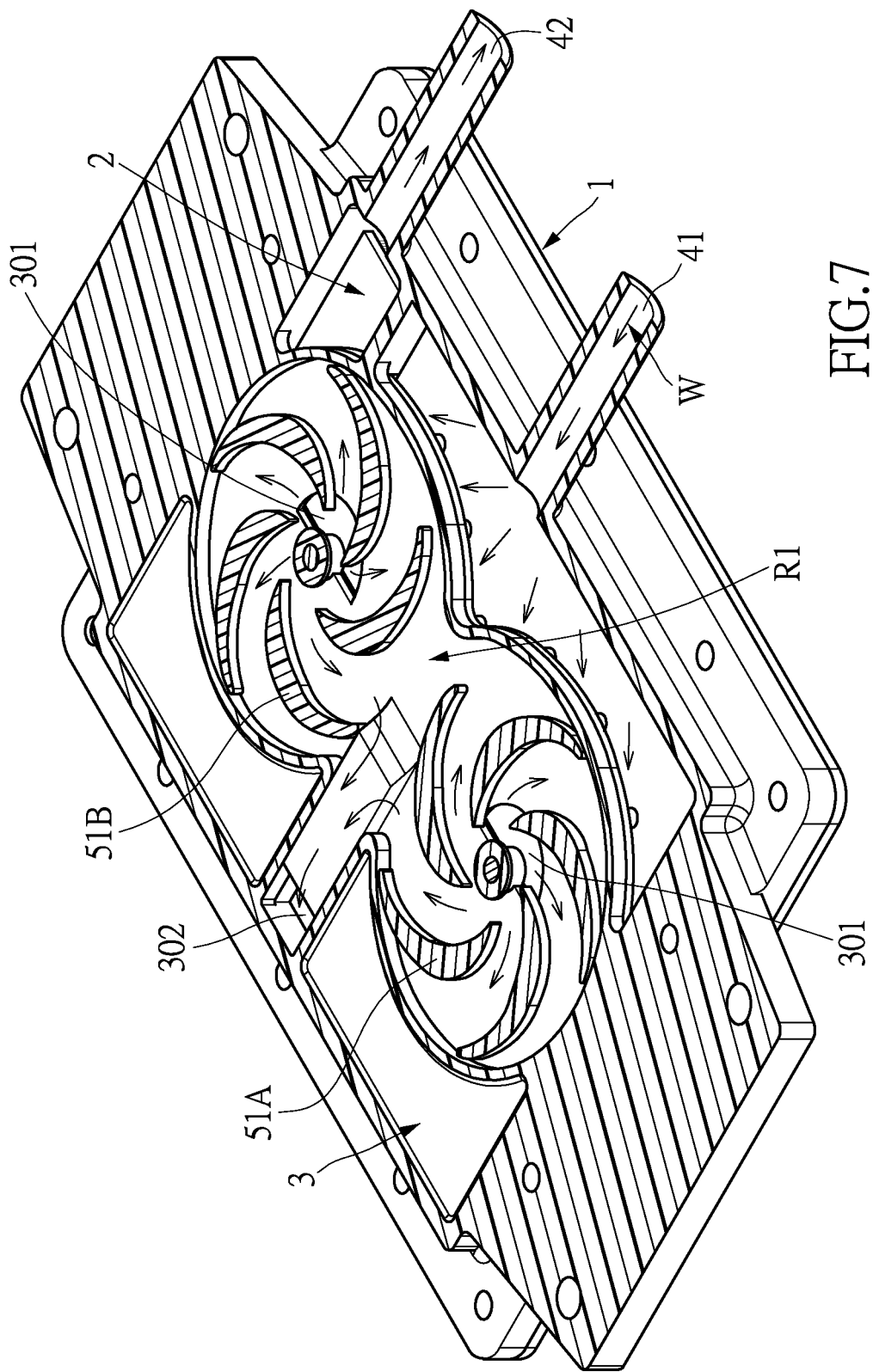
FIG. 7 shows a perspective, cross-sectional view taken along the section line C-C of FIG. 3.
Figure 8:
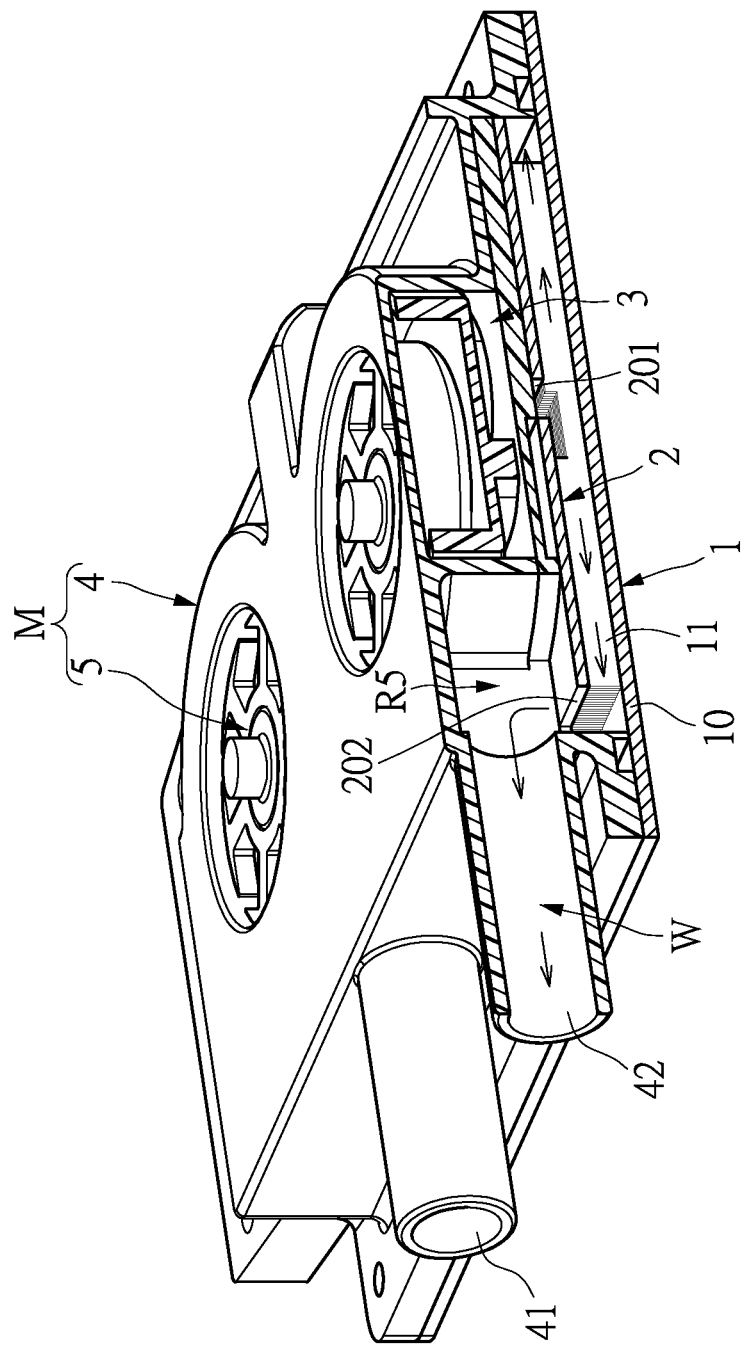
FIG. 8 shows a perspective, cross-sectional view taken along the section line D-D of FIG. 3.

Referring to FIG. 1 to FIG. 9, FIG. 4 shows a perspective, cross-sectional view taken along the section line A-A of FIG. 3, FIG. 5 shows a lateral, cross-sectional view taken along the section line A-A of FIG. 3, FIG. 6 shows a perspective, cross-sectional view taken along the section line B-B of FIG. 3, FIG. 7 shows a perspective, cross-sectional view taken along the section line C-C of FIG. 3, and FIG. 8 shows a perspective, cross-sectional view taken along the section line D-D of FIG. 3. The instant disclosure provides a liquid cooling heat dissipation structure Z, comprising: a heat-conducting substrate 1, a fluid-splitting board 2, a fluid-conducting board 3, and a liquid supply module M.

Figure 1:
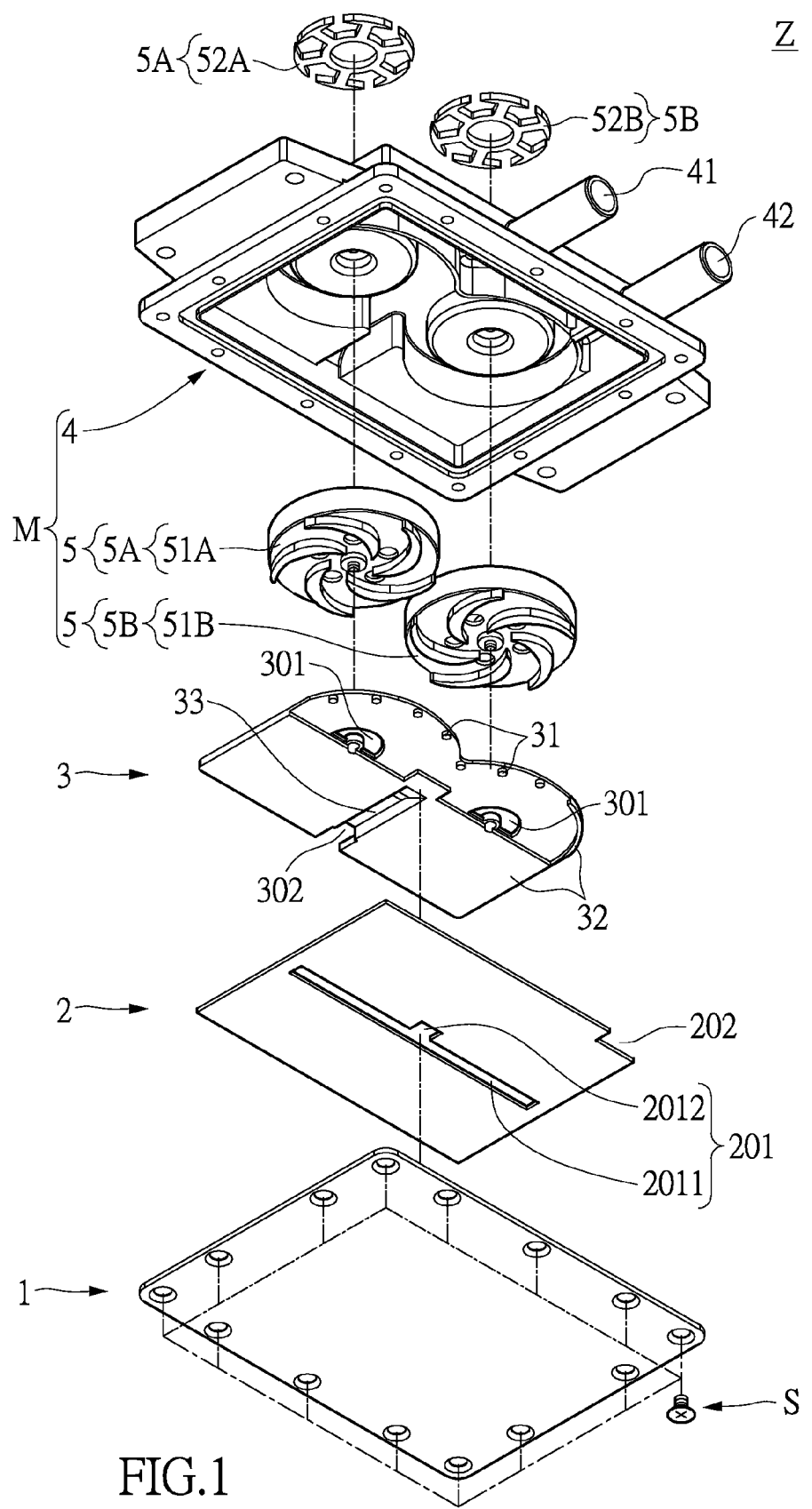
FIG. 1 shows a perspective, exploded, schematic view of the liquid cooling heat dissipation structure according to the instant disclosure.
Figure 2:
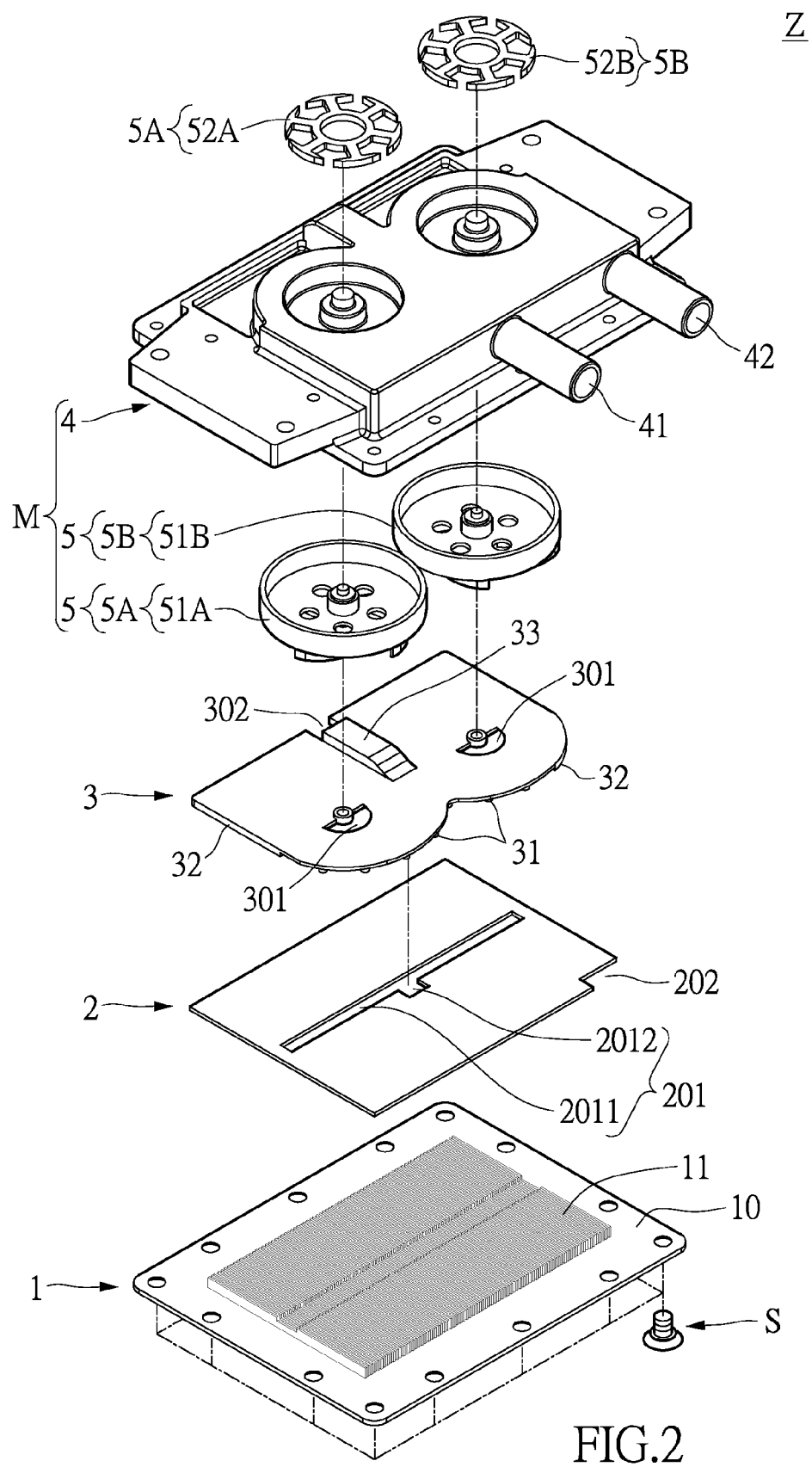
FIG. 2 shows another perspective, exploded, schematic view of the liquid cooling heat dissipation structure according to the instant disclosure.

First, referring to FIG. 1 (or FIG. 2), and FIG. 4 (or FIG. 5), the heat-conducting substrate 1 has a heat-conducting body 10 contacting a heat generation source H (such as a CPU chip or any heat-generating chip) and a plurality of heat-dissipating fins 11 disposed on the heat-conducting body 10. In addition, the fluid-splitting board 2 is disposed on the heat-dissipating fins 11, and the fluid-conducting board 3 is disposed on the fluid-splitting board 2. Moreover, the liquid supply module M includes an external cover body 4 detachably disposed on the heat-conducting body 10 and at least two pumps 5 (such as two radial-flow centrifugal impellers) detachably disposed on the external cover body 4 in parallel, and all of the heat-dissipating fins 11, the fluid-splitting board 2, and the fluid-conducting board 3 are received inside the external cover body 4.

For example, referring to FIG. 1 (or FIG. 2), and FIG. 4 (or FIG. 5), the external cover body 4 is detachably disposed on the heat-conducting substrate 1 through bolts (screws) S. In addition, one of the at least two pumps 5 (such as a first pump 5A) includes a first rotary component 51A (such as a first rotor) detachably disposed between the external cover body 4 and the fluid-conducting board 3 and a first fixing component 52A (such as a first stator) disposed on the external cover body 4 and corresponding to the first rotary component 51A. The other pump 5 (such as a second pump 5B) includes a second rotary component 51B (such as a second rotor) detachably disposed between the external cover body 4 and the fluid-conducting board 3 and adjacent to the first rotary component 51A and a second fixing component 52B (such as a second stator) disposed on the external cover body 4 and corresponding to the second rotary component 51B. However, the aforementioned design for the at least two pumps 5 is merely an example and is not meant to limit the instant disclosure.

More particularly, referring to FIG. 1 (or FIG. 2), FIG. 4 (or FIG. 5), and FIG. 7, the fluid-conducting board 3 has at least two first fluid-conducting openings 301 respectively corresponding to the at least two pumps 5 and a second fluid-conducting opening 302 communicated with the at least two first fluid-conducting openings 301 through a first receiving space R1. In addition, referring to FIG. 1 (or FIG. 2), FIG. 4 (or FIG. 5), FIG. 6, and FIG. 9, the fluid-splitting board 2 has a first fluid-splitting opening 201 communicated with the second fluid-conducting opening 302 through a second receiving space R2 and a second fluid-splitting opening 202 communicated with the first fluid-splitting opening 201 through a third receiving space R3. For example, the first fluid-splitting opening 201 of the fluid-splitting board 2 has a strip-shaped opening portion 2011 and a buffer opening portion 2012 communicated with the strip-shaped opening portion 2011. In other words, after a cooling liquid W passes through the at least two first fluid-conducting openings 301, the cooling liquid W can pass through the first receiving space R1, the second receiving space R2, and the third receiving space R3, and then can be gathered at the second fluid-splitting opening 202 (as shown in FIG. 9).

More particularly, referring to FIG. 1 (or FIG. 2), FIG. 4 (or FIG. 5), FIG. 6, and FIG. 9, the external cover body 4 has at least one liquid inlet 41 communicated with the at least two first fluid-conducting openings 301 through a fourth receiving space R4 and at least one liquid outlet 42 communicated with the second fluid-splitting opening 202 through a fifth receiving space R5, and the cooling liquid W can flow into the external cover body 4 through the at least one liquid inlet 41 and flow out of the external cover body 4 through the at least one liquid outlet 42 by driving one or all of the at least two pumps 5.

For example, referring to FIG. 1 (or FIG. 2) and FIG. 4 (or FIG. 5), the fluid-conducting board 3 has a plurality of support portions 31 disposed on the bottom side thereof to directly contact the fluid-splitting board 2 and a plurality of wall portions 32 disposed on the bottom side thereof to directly contact the fluid-splitting board 2, and the fluid-conducting board 3 has a convex portion 33 disposed on the top side thereof and between the first receiving space R1 and the second receiving space R2. In addition, the first receiving space R1 is formed between the external cover body 4 and the fluid-conducting board 3, both the second receiving space R2 and the fourth receiving space R4 are formed between the fluid-conducting board 3 and the fluid-splitting board 2, the third receiving space R3 is formed between the fluid-splitting board 2 and the heat-conducting body 10, and the second receiving space R2 and the fourth receiving space R4 are isolated from each other through the wall portions 32. However, the aforementioned description is merely an example and is not meant to limit the instant disclosure.

Figure 9:
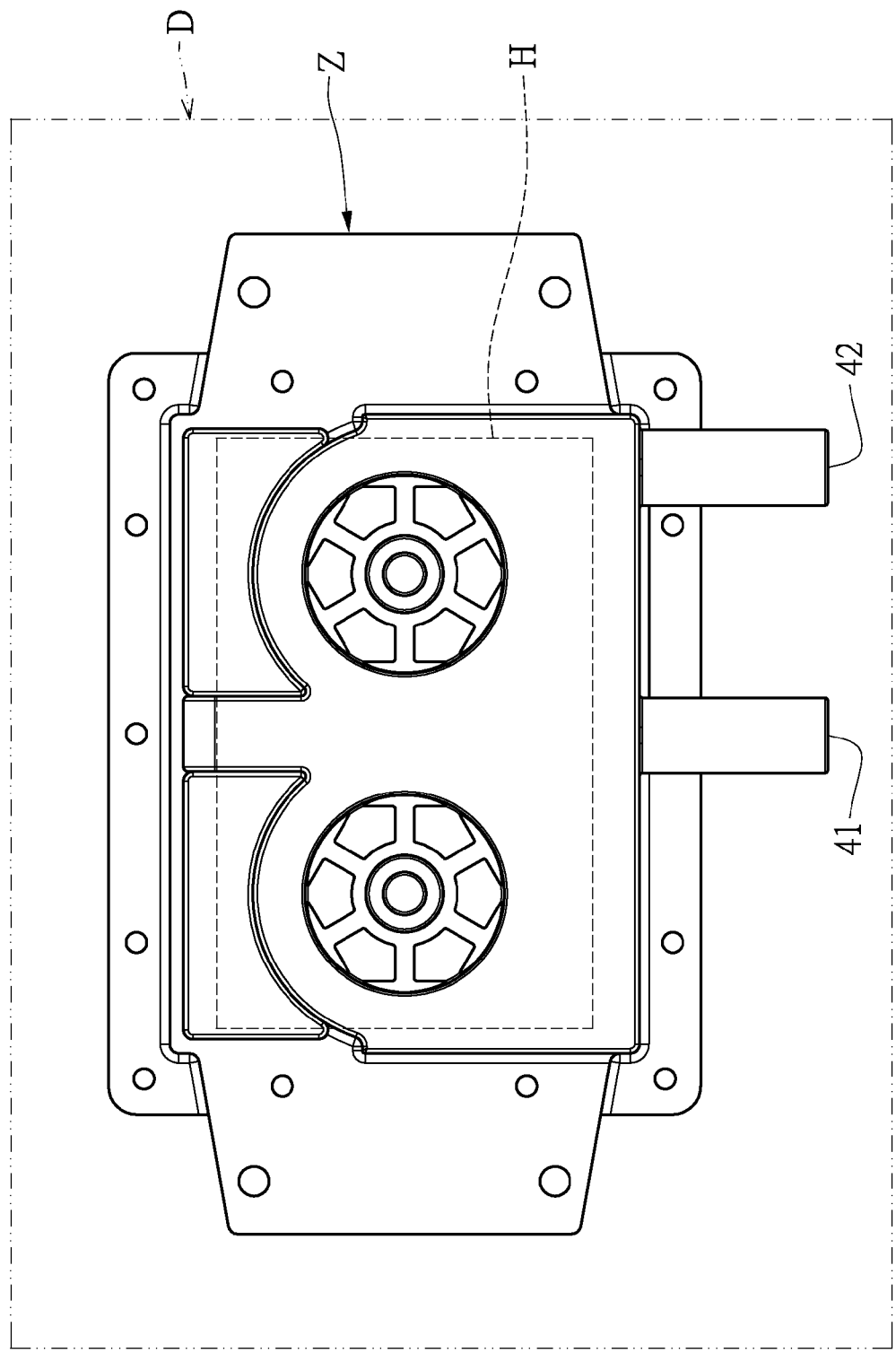
FIG. 9 shows a top, schematic view of the electronic device using the liquid cooling heat dissipation structure according to the instant disclosure.

Referring to FIG. 9, the instant disclosure provides an electronic device D (such as a computer host) including a liquid cooling heat dissipation structure Z disposed on at least one heat generation source H thereof for dissipating heat from the at least one heat generation source H. Please note, the electronic device D can be replaced by any type of heat-dissipating plate, and the liquid cooling heat dissipation structure Z can be disposed on the heat-dissipating plate for increasing the heat-dissipating efficiency of the heat-dissipating plate.

Figure 10:
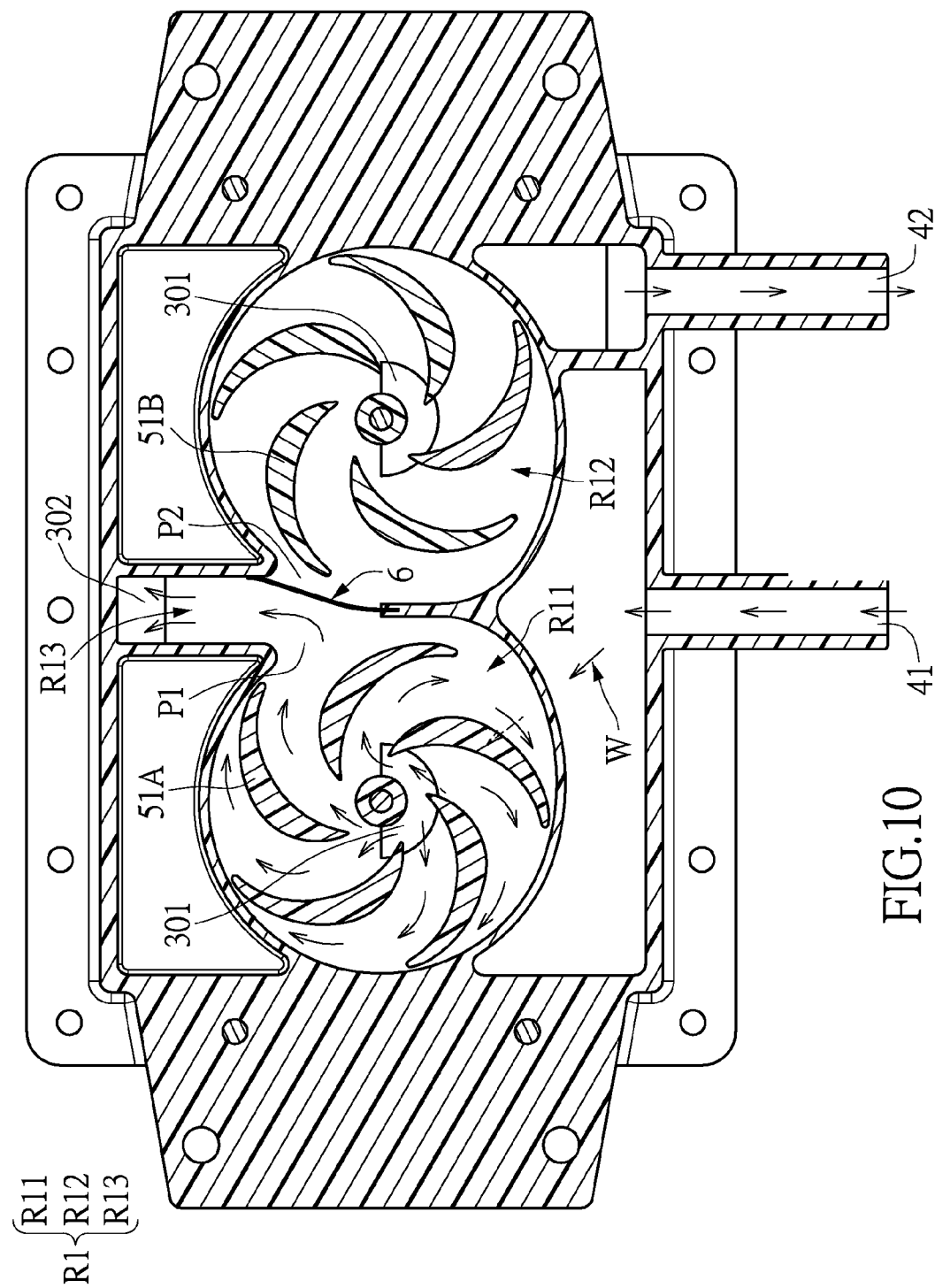
FIG. 10 shows a schematic view of the liquid cooling heat dissipation structure only using a first rotary component according to the instant disclosure.
Figure 11:
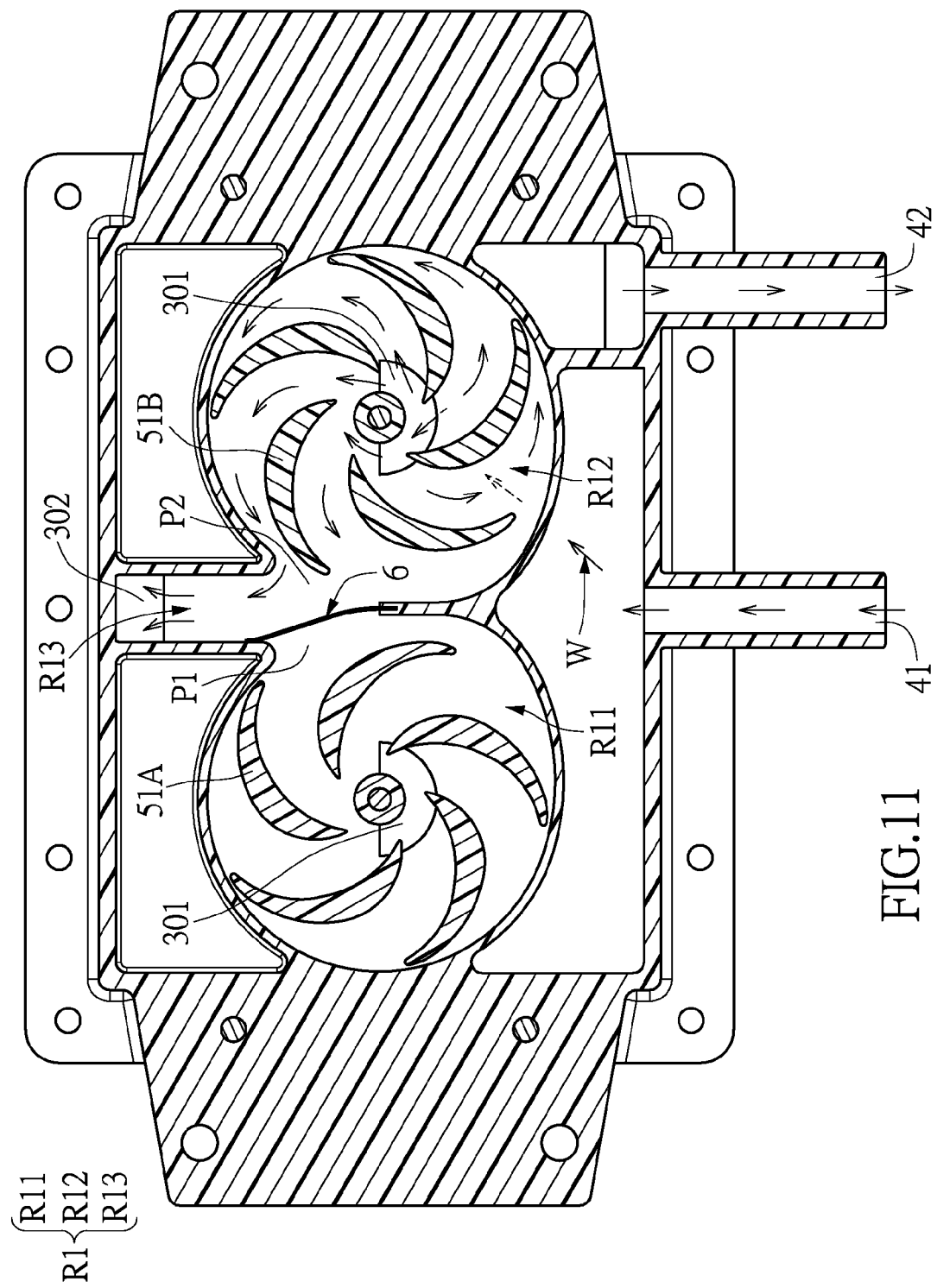
FIG. 11 shows a schematic view of the liquid cooling heat dissipation structure only using a second rotary component according to the instant disclosure.

Referring to FIG. 10 to FIG. 12, the first receiving space R1 has a first space portion R11 for receiving the first rotary component 51A and being communicated with one of the at least two first fluid-conducting openings 301, a second space portion R12 for receiving the second rotary component 51B and being communicated with the other first fluid-conducting opening 301, and a common space portion R13 corresponding to the first space portion R11 and the second space portion R12 and communicated with the second fluid-conducting opening 302. In addition, the common space portion R13 is communicated with the first space portion R11 through a first connection opening P1, and the common space portion R13 is communicated with the second space portion R12 through a second connection opening P2. More particularly, the liquid cooling heat dissipation structure Z further comprises a movable component 6 (such as a flexible switching component) disposed among the first space portion R11, the second space portion R12, and the common space portion R13.

For an example, as shown in FIG. 10, when the cooling liquid W flows inside the external cover body 4 by driving the first rotary component 51A only, the movable component 6 is pushed toward the second space portion R12 to enclose the second connection opening P2 by the cooling liquid W, so that the cooling liquid W is transmitted to the common space portion R13 through the first connection opening P1 only.

For another example, as shown in FIG. 11, when the cooling liquid W flows inside the external cover body 4 by driving the second rotary component 51B only, the movable component 6 is pushed toward the first space portion R11 to enclose the first connection opening P1 by the cooling liquid W, so that the cooling liquid W is transmitted to the common space portion R13 through the second connection opening P2 only.

For yet another example, as shown in FIG. 12, when the cooling liquid W flows inside the external cover body 4 by concurrently driving the first rotary component 51A and the second rotary component 51B, the movable component 6 is pushed and substantially disposed between the first space portion R11 and the second space portion R12 for concurrently opening the first connection opening P1 and the second connection opening P2 by the cooling liquid W, so that the cooling liquid W is transmitted to the common space portion R13 through both the first connection opening P1 and the second connection opening P2.

Therefore, one or all of the first rotary component 51A and the second rotary component 51B can be turned on according to different heat-dissipating requirements of the liquid cooling heat dissipation structure Z. For example, one of the first rotary component 51A and the second rotary component 51B is turned on according to lower heat-dissipating requirement of the liquid cooling heat dissipation structure Z. All of the first rotary component 51A and the second rotary component 51B are turned on according to higher heat-dissipating requirement of the liquid cooling heat dissipation structure Z.

In conclusion, the heat dissipation efficiency of the electronic device D and the liquid cooling heat dissipation structure Z is increased due to the design of "the liquid supply module M including an external cover body 4 detachably disposed on the heat-conducting body 10 and at least two pumps 5 detachably disposed on the external cover body 4". In addition, one or all of the first rotary component 51A and the second rotary component 51B can be turned on according to different heat-dissipating requirements of the liquid cooling heat dissipation structure Z.

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. A liquid cooling heat dissipation structure, comprising:
   a heat-conducting substrate having a heat-conducting body contacting a heat generation source and a plurality of heat-dissipating fins disposed on the heat-conducting body;
   a fluid-splitting board disposed on the heat-dissipating fins;
   a fluid-conducting board disposed on the fluid-splitting board; and
   a liquid supply module including an external cover body detachably disposed on the heat-conducting body and at least two pumps detachably disposed on the external cover body, wherein the heat-dissipating fins, the fluid-splitting board, and the fluid-conducting board are received inside the external cover body;
   wherein the fluid-conducting board has at least two first fluid-conducting openings respectively corresponding to the at least two pumps and a second fluid-conducting opening communicated with the at least two first fluid-conducting openings through a first receiving space, and the fluid-splitting board has a first fluid-splitting opening communicated with the second fluid-conducting opening through a second receiving space and a second fluid-splitting opening communicated with the first fluid-splitting opening through a third receiving space;
   wherein the external cover body has at least one liquid inlet communicated with the at least two first fluid-conducting openings through a fourth receiving space and at least one liquid outlet communicated with the second fluid-splitting opening through a fifth receiving space, and cooling liquid flows into the external cover body through the at least one liquid inlet and flows out of the external cover body through the at least one liquid outlet by driving one or all of the at least two pumps.

2. The liquid cooling heat dissipation structure of claim 1, wherein the fluid-conducting board has a plurality of support portions disposed on the bottom side thereof to directly contact the fluid-splitting board and a plurality of wall portions disposed on the bottom side thereof to directly contact the fluid-splitting board, and the fluid-conducting board has a convex portion disposed on the top side thereof and between the first receiving space and the second receiving space, wherein the first fluid-splitting opening of the fluid-splitting board has a strip-shaped opening portion and a buffer opening portion communicated with the strip-shaped opening portion.

3. The liquid cooling heat dissipation structure of claim 2, wherein the first receiving space is formed between the external cover body and the fluid-conducting board, both the second receiving space and the fourth receiving space are formed between the fluid-conducting board and the fluid-splitting board, the third receiving space is formed between the fluid-splitting board and the heat-conducting body, and the second receiving space and the fourth receiving space are isolated from each other through the wall portions.

4. The liquid cooling heat dissipation structure of claim 1, wherein one of the at least two pumps has a first rotary component disposed between the external cover body and the fluid-conducting board, the other pump has a second rotary component disposed between the external cover body and the fluid-conducting board and adjacent to the first rotary component, wherein the first receiving space has a first space portion receiving the first rotary component and communicated with one of the at least two first fluid-conducting openings, a second space portion receiving the second rotary component and communicated with the other first fluid-conducting opening, and a common space portion corresponding to the first space portion and the second space portion and communicated with the second fluid-conducting opening, wherein the common space portion is communicated with the first space portion through a first connection opening, and the common space portion is communicated with the second space portion through a second connection opening.

5. The liquid cooling heat dissipation structure of claim 4, further comprising: a movable component disposed among the first space portion, the second space portion, and the common space portion.

6. The liquid cooling heat dissipation structure of claim 5, wherein when the cooling liquid flows inside the external cover body by driving the first rotary component only, the movable component is pushed toward the second space portion to enclose the second connection opening by the cooling liquid, so that the cooling liquid is transmitted to the common space portion through the first connection opening only.

7. The liquid cooling heat dissipation structure of claim 5, wherein when the cooling liquid flows inside the external cover body by driving the second rotary component only, the movable component is pushed toward the first space portion to enclose the first connection opening by the cooling liquid, so that the cooling liquid is transmitted to the common space portion through the second connection opening only.

8. The liquid cooling heat dissipation structure of claim 5, wherein when the cooling liquid flows inside the external cover body by concurrently driving the first rotary component and the second rotary component, the movable component is pushed and substantially disposed between the first space portion and the second space portion for concurrently opening the first connection opening and the second connection opening by the cooling liquid, so that the cooling liquid is transmitted to the common space portion through both the first connection opening and the second connection opening.

9. An electronic device including a liquid cooling heat dissipation structure disposed on at least one heat generation source thereof, the liquid cooling heat dissipation structure comprising:
   a heat-conducting substrate having a heat-conducting body contacting the at least one heat generation source and a plurality of heat-dissipating fins disposed on the heat-conducting body;

a fluid-splitting board disposed on the heat-dissipating fins;

a fluid-conducting board disposed on the fluid-splitting board; and a liquid supply module including an external cover body detachably disposed on the heat-conducting body and at least two pumps detachably disposed on the external cover body, wherein the heat-dissipating fins, the fluid-splitting board, and the fluid-conducting board are received inside the external cover body;

wherein the fluid-conducting board has at least two first fluid-conducting openings respectively corresponding to the at least two pumps and a second fluid-conducting opening communicated with the at least two first fluid-conducting openings through a first receiving space, and the fluid-splitting board has a first fluid-splitting opening communicated with the second fluid-conducting opening through a second receiving space and a second fluid-splitting opening communicated with the first fluid-splitting opening through a third receiving space;

wherein the external cover body has at least one liquid inlet communicated with the at least two first fluid-conducting openings through a fourth receiving space and at least one liquid outlet communicated with the second fluid-splitting opening through a fifth receiving space, and cooling liquid flows into the external cover body through the at least one liquid inlet and flows out of the external cover body through the at least one liquid outlet by driving one or all of the at least two pumps.

10. The electronic device of claim 9, wherein the fluid-conducting board has a plurality of support portions disposed on the bottom side thereof to directly contact the fluid-splitting board and a plurality of wall portions disposed on the bottom side thereof to directly contact the fluid-splitting board, and the fluid-conducting board has a convex portion disposed on the top side thereof and between the first receiving space and the second receiving space, wherein the first fluid-splitting opening of the fluid-splitting board has a strip-shaped opening portion and a buffer opening portion communicated with the strip-shaped opening portion.

11. The electronic device of claim 10, wherein the first receiving space is formed between the external cover body and the fluid-conducting board, both the second receiving space and the fourth receiving space are formed between the fluid-conducting board and the fluid-splitting board, the third receiving space is formed between the fluid-splitting board and the heat-conducting body, and the second receiving space and the fourth receiving space are isolated from each other through the wall portions.

12. The electronic device of claim 9, wherein one of the at least two pumps has a first rotary component disposed between the external cover body and the fluid-conducting board, the other pump has a second rotary component disposed between the external cover body and the fluid-conducting board and adjacent to the first rotary component, wherein the first receiving space has a first space portion receiving the first rotary component and communicated with one of the at least two first fluid-conducting openings, a second space portion receiving the second rotary component and communicated with the other first fluid-conducting opening, and a common space portion corresponding to the first space portion and the second space portion and communicated with the second fluid-conducting opening, wherein the common space portion is communicated with the first space portion through a first connection opening, and the common space portion is communicated with the second space portion through a second connection opening.

13. The electronic device of claim 12, wherein the liquid cooling heat dissipation structure includes a movable component disposed among the first space portion, the second space portion, and the common space portion.

14. The electronic device of claim 13, wherein when the cooling liquid flows inside the external cover body by driving the first rotary component only, the movable component is pushed toward the second space portion to enclose the second connection opening by the cooling liquid, so that the cooling liquid is transmitted to the common space portion through the first connection opening only.

15. The electronic device of claim 13, wherein when the cooling liquid flows inside the external cover body by driving the second rotary component only, the movable component is pushed toward the first space portion to enclose the first connection opening by the cooling liquid, so that the cooling liquid is transmitted to the common space portion through the second connection opening only.

16. The electronic device of claim 13, wherein when the cooling liquid flows inside the external cover body by concurrently driving the first rotary component and the second rotary component, the movable component is pushed and substantially disposed between the first space portion and the second space portion for concurrently opening the first connection opening and the second connection opening by the cooling liquid, so that the cooling liquid is transmitted to the common space portion through both the first connection opening and the second connection opening.

* * * * *